(12) United States Patent
Yamashita et al.

(10) Patent No.: US 9,496,334 B2
(45) Date of Patent: Nov. 15, 2016

(54) SEMICONDUCTOR DEVICE

(71) Applicant: Kabushiki Kaisha Toshiba, Minato-ku, Tokyo (JP)

(72) Inventors: Hiroaki Yamashita, Hakusan Ishikawa (JP); Syotaro Ono, Kanazawa Ishikawa (JP); Hideyuki Ura, Nonoichi Ishikawa (JP); Masahiro Shimura, Hakusan Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/826,788

(22) Filed: Aug. 14, 2015

(65) Prior Publication Data

US 2016/0276427 A1  Sep. 22, 2016

(30) Foreign Application Priority Data

Mar. 16, 2015  (JP) .................. 2015-051709

(51) Int. Cl.
  *H01L 29/06* (2006.01)
  *H01L 29/78* (2006.01)
  (Continued)

(52) U.S. Cl.
  CPC ....... *H01L 29/0634* (2013.01); *H01L 29/0696* (2013.01); *H01L 29/086* (2013.01); *H01L 29/1095* (2013.01); *H01L 29/402* (2013.01); *H01L 29/7813* (2013.01)

(58) Field of Classification Search
  CPC ....... H01L 29/06; H01L 29/78; H01L 29/40; H01L 29/10; H01L 29/08
  USPC ........................................................ 257/330
  See application file for complete search history.

(56) References Cited

U.S. PATENT DOCUMENTS 8,125,023 B2  2/2012  Ohta et al.
8,716,789 B2  5/2014  Ono et al.
(Continued)

FOREIGN PATENT DOCUMENTS

| CN | 104282755 A | 1/2015 |
|---|---|---|
| JP | 2013-149999 A | 8/2013 |
| TW | 2012-34591 A | 8/2012 |

OTHER PUBLICATIONS

Taiwanese Office Action issued on Aug. 17, 2016 in counterpart Taiwanese patent application No. 104128906, along with an English translation thereof.

*Primary Examiner* — Asok K Sarkar
*Assistant Examiner* — Dmitriy Yemelyanov
(74) *Attorney, Agent, or Firm* — White & Case LLP

(57) ABSTRACT

A semiconductor device according to an embodiment includes a first semiconductor layer of a first conductivity type, second semiconductor regions of a second conductivity type, a third semiconductor region of the second conductivity type, a fourth semiconductor region of the first conductivity type, a gate electrode, an insulating layer, and a first electrode. The first semiconductor layer includes first semiconductor regions. The second semiconductor regions are provided respectively between the first semiconductor regions. The insulating layer is provided between the gate electrode and the third semiconductor region. The first electrode includes a first portion and a second portion. The first portion is connected to the first semiconductor region. The second portion is provided on the fourth semiconductor region side of the first portion. The first electrode is provided on the first semiconductor region and on the second semiconductor region. The first electrode is provided around the fourth semiconductor region.

15 Claims, 14 Drawing Sheets

(51) Int. Cl.
*H01L 29/40* (2006.01)
*H01L 29/10* (2006.01)
*H01L 29/08* (2006.01)

(56) References Cited

U.S. PATENT DOCUMENTS

2006/0220156 A1* 10/2006 Saito .................. H01L 29/0619
257/409

2008/0135930 A1* 6/2008 Saito .................. H01L 29/0634
257/330
2012/0074491 A1  3/2012 Ohta et al.
2013/0248979 A1* 9/2013 Ono .................... H01L 29/7395
257/329
2013/0277763 A1 10/2013 Ohta et al.
2015/0014826 A1  1/2015 Ura et al.

* cited by examiner

SEMICONDUCTOR DEVICE

CROSS-REFERENCE TO RELATED APPLICATIONS

This application is based upon and claims the benefit of priority from Japanese Patent Application No. 2015-051709, filed on Mar. 16, 2015; the entire contents of which are incorporated herein by reference.

FIELD

Embodiments described herein relate generally to a semiconductor device.

BACKGROUND

A super junction structure may be used in a semiconductor device such as a MOSFET (Metal Oxide Semiconductor Field Effect Transistor), an IGBT (Insulated Gate Bipolar Transistor), etc. By using the super junction structure, it is possible to increase the effective doping concentration of the drift layer; and the trade-off relationship between the breakdown voltage and the on-resistance or the trade-off relationship between the breakdown voltage and the on-voltage is improved.

The super junction structure may be provided not only in the element region but also in the terminal region. By providing the super junction structure in the terminal region as well, the electric field spreads into the terminal region easily; and the concentration of the electric field in the element region is suppressed. On the other hand, when the electric field spreads into the terminal region, there is a possibility that the electric field may concentrate in the terminal region; and the breakdown voltage may decrease.

DETAILED DESCRIPTION

Figure 1:
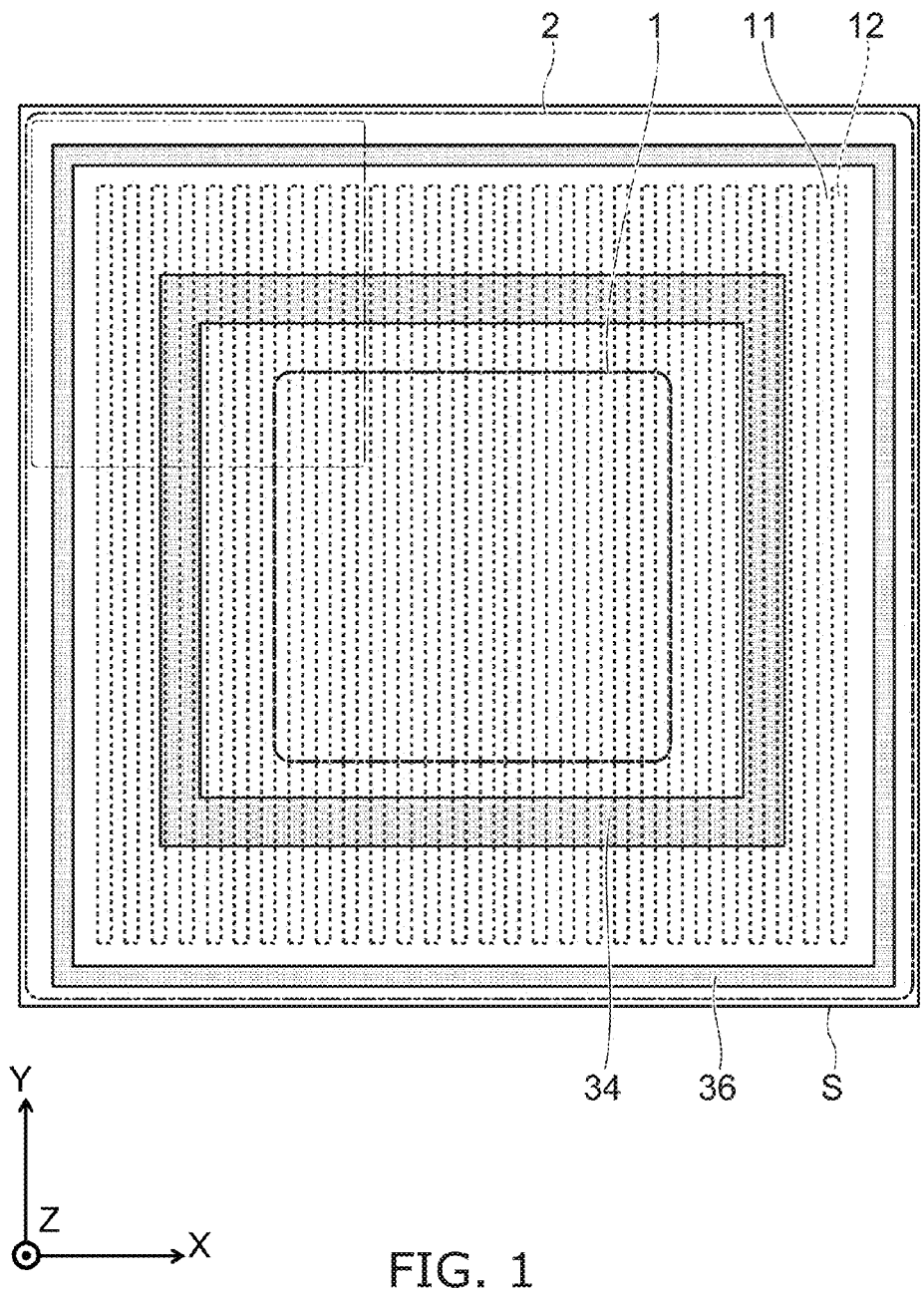
FIG. 1 is a plan view showing the semiconductor device according to the first embodiment.

A semiconductor device according to an embodiment includes a first semiconductor layer of a first conductivity type, multiple second semiconductor regions of a second conductivity type, a third semiconductor region of the second conductivity type, a fourth semiconductor region of the first conductivity type, a gate electrode, an insulating layer, and a first electrode. The first semiconductor layer includes multiple first semiconductor regions. The second semiconductor regions are provided respectively between the first semiconductor regions. The third semiconductor region is provided on the second semiconductor region. The fourth semiconductor region is provided on the third semiconductor region. The insulating layer is provided between the gate electrode and the third semiconductor region. The first electrode includes a first portion and a second portion. The first portion is connected to the first semiconductor region. The second portion is provided on the fourth semiconductor region side of the first portion. The first electrode is provided on the first semiconductor region and on the second semiconductor region. The first electrode is provided around the fourth semiconductor region.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. There are also cases where the dimensions and/or the proportions are illustrated differently between the drawings, even in the case where the same portion is illustrated.

In the drawings and the specification of the application, components similar to those described thereinabove are marked with like reference numerals, and a detailed description is omitted as appropriate.

An XYZ orthogonal coordinate system is used in the description of the embodiments. Two mutually-orthogonal directions parallel to a major surface of a structural body S are taken as an X-direction (a first direction) and a Y-direction (a second direction); and a direction orthogonal to both the X-direction and the Y-direction is taken as a Z-direction.

The embodiments described below may be implemented by reversing the p-type and the n-type for each of the semiconductor regions.

First Embodiment

A semiconductor device 100 according to a first embodiment will now be described using FIG. 1 to FIG. 5.

FIG. 1 is a plan view showing the semiconductor device 100 according to the first embodiment.

Figure 2:
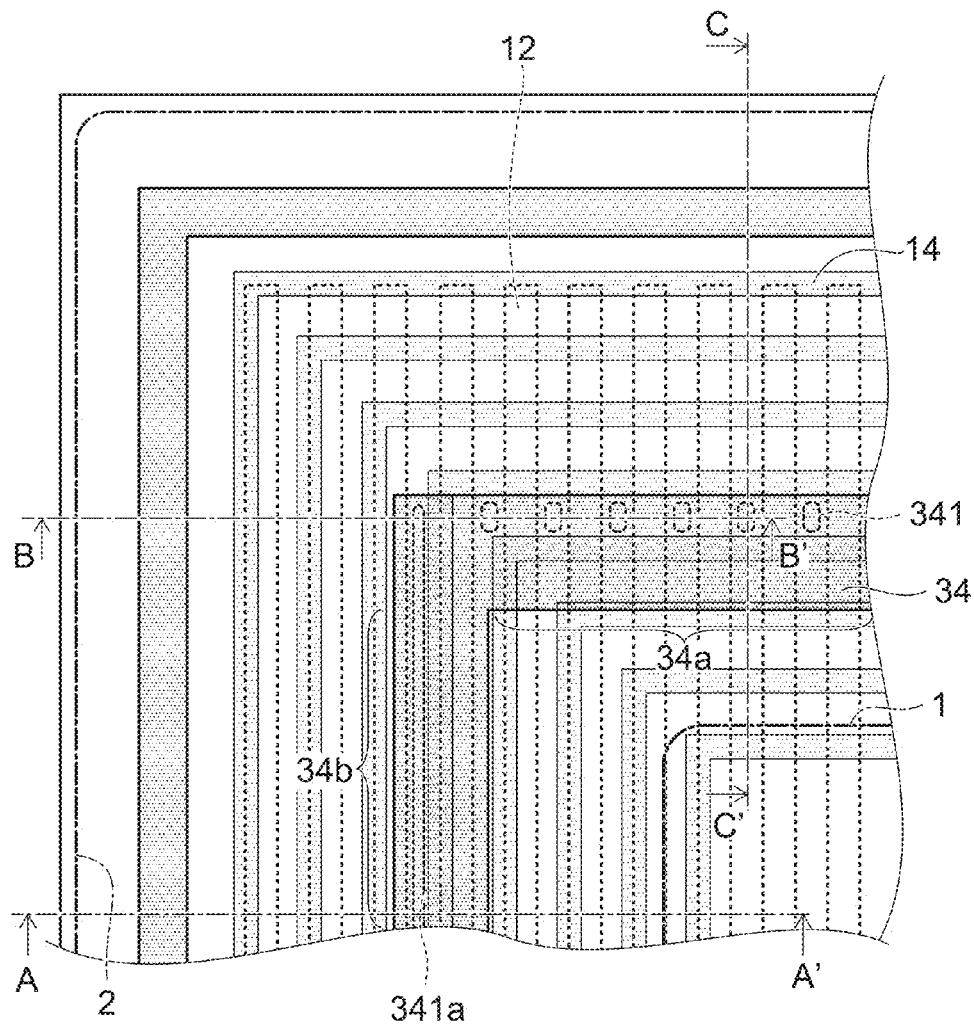
FIG. 2 is a plan view showing a portion of the semiconductor device according to the first embodiment.

FIG. 2 is a plan view showing a portion of the semiconductor device 100 according to the first embodiment.

Figure 3:
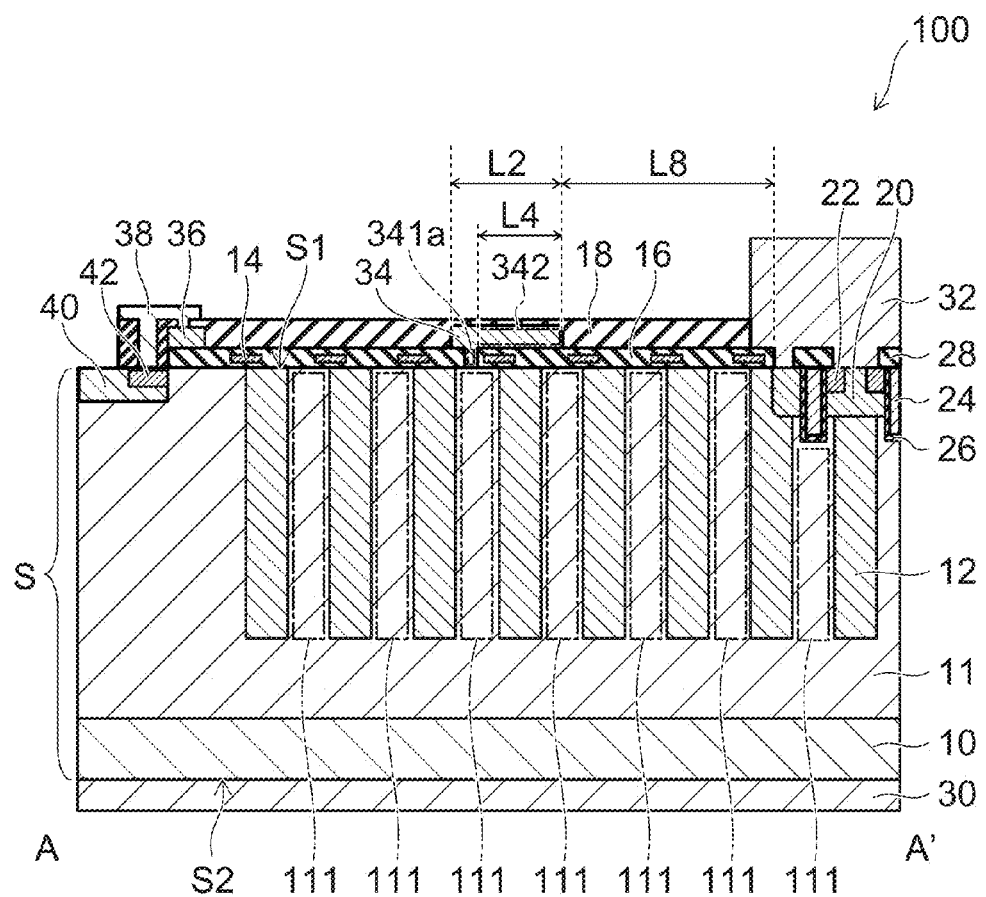
FIG. 3 is an A-A' cross-sectional view of FIG. 2.
Figure 3:
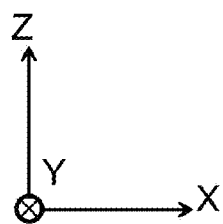

FIG. 3 is an A-A' cross-sectional view of FIG. 2.

Figure 4:
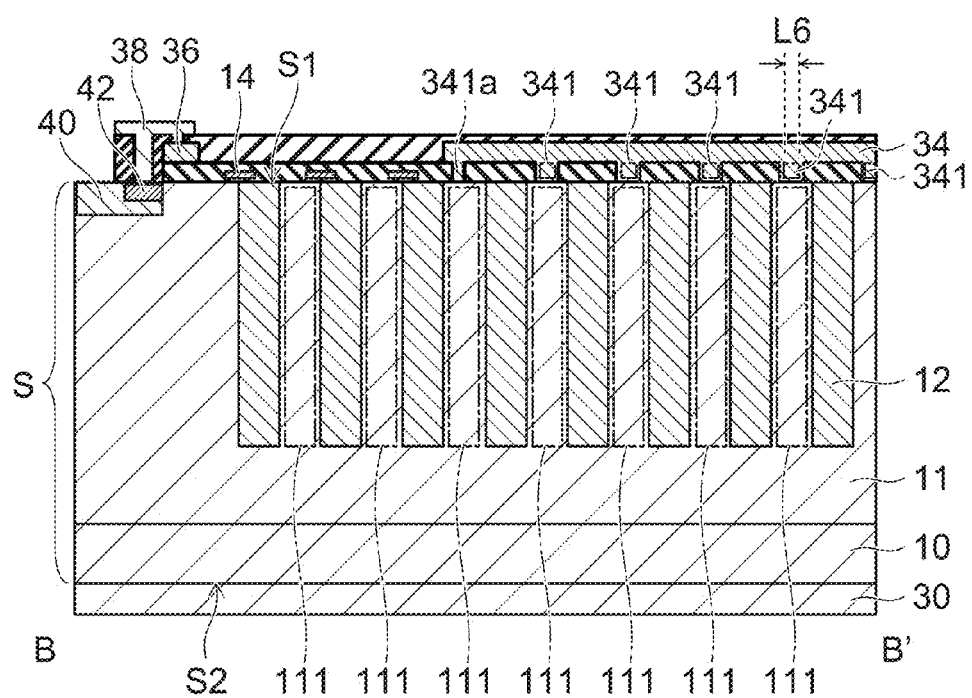
FIG. 4 is a B-B' cross-sectional view of FIG. 2.
Figure 4:
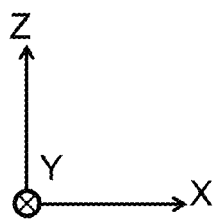

FIG. 4 is a B-B' cross-sectional view of FIG. 2.

Figure 5:
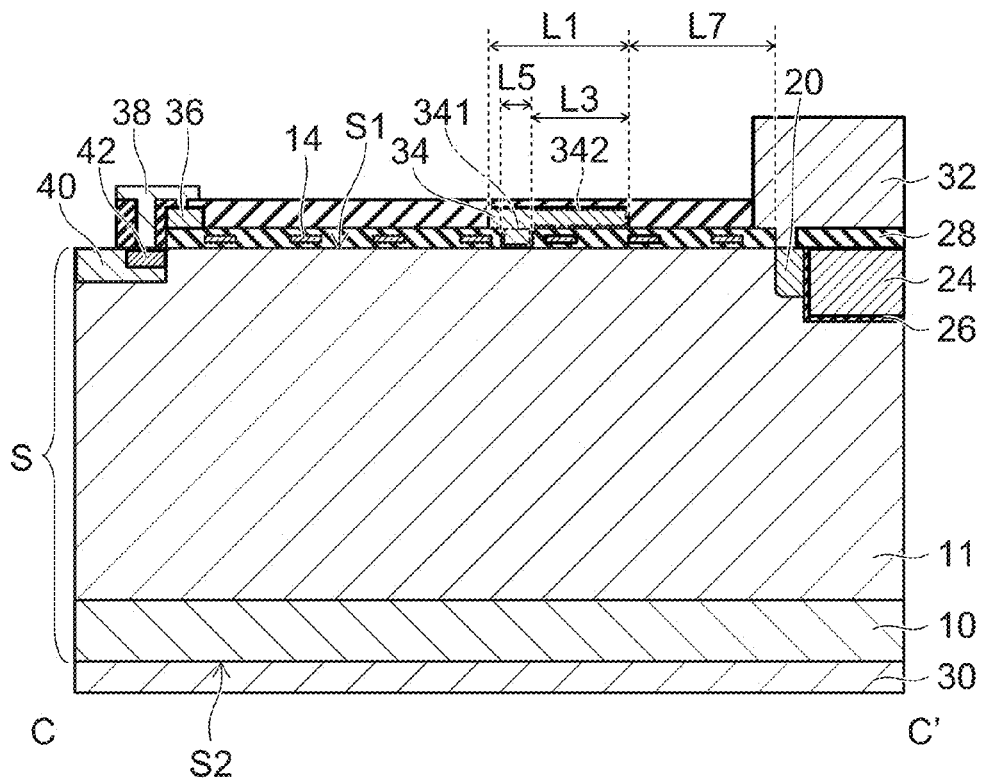
FIG. 5 is a C-C' cross-sectional view of FIG. 2.

FIG. 5 is a C-C' cross-sectional view of FIG. 2.

The components other than an n-type semiconductor layer 11, a p-type semiconductor region 12, a first electrode 34, and an EQPR electrode 36 are not shown in FIG. 1 and FIG. 2.

The semiconductor device 100 according to the first embodiment is, for example, a MOSFET.

The semiconductor device according to the first embodiment includes a structural body (a structural body S), a gate electrode, a gate insulation layer, a drain electrode, a source electrode, a field plate electrode, a first electrode (the first electrode 34), a second electrode (the EQPR electrode 36), and a fourth electrode (a field plate electrode 14).

The structural body includes a first semiconductor layer (the n-type semiconductor layer 11) of the first conductivity type, multiple second semiconductor regions (the p-type semiconductor regions 12) of the second conductivity type, a third semiconductor region (a base region 20) of the second conductivity type, a fourth semiconductor region (a source region 22) of the first conductivity type, a fifth semiconductor region (a p-type semiconductor region 40) of the second conductivity type, a sixth semiconductor region (an n-type semiconductor region 42) of the first conductivity type, and a seventh semiconductor region (a drain region 10) of the first conductivity type.

A major component of the structural body S is, for example, silicon. The structural body S has a front surface S1 and a back surface S2. Among the surfaces of the structural body S, the front surface S1 is the surface on a source electrode 32 side; and the back surface S2 is the surface on a drain electrode 30 side.

The region of the structural body S where the MOSFET including the base region 20 and the source region 22 is formed is called an element region 1. The region of the structural body S other than the element region 1 is called a terminal region 2. As shown in FIG. 1, the terminal region 2 is provided around the element region 1.

As shown in FIG. 3, the drain region 10 is provided on the back surface S2 side of the structural body S. The drain region 10 is provided in both the element region 1 and the terminal region 2. The drain region 10 is an n-type semiconductor region. The drain region 10 is electrically connected to the drain electrode 30.

The n-type semiconductor layer 11 is provided on the drain region 10 in the element region 1 and the terminal region 2. The n-type carrier concentration of the n-type semiconductor layer 11 is lower than the n-type carrier concentration of the drain region 10.

The n-type semiconductor layer 11 includes multiple pillar portions (the first semiconductor regions) 111 provided between the p-type semiconductor regions 12 in the X-direction. Each of the pillar portions 111 extends in the Y-direction.

The p-type semiconductor regions 12 are selectively provided inside the n-type semiconductor layer 11 in the element region 1 and the terminal region 2. In the embodiment, the p-type semiconductor regions 12 are multiply provided in the X-direction. The p-type semiconductor regions 12 are provided alternately in the X-direction with the pillar portions 111 of the n-type semiconductor layer 11. For example, the p-type semiconductor regions 12 are provided at uniform spacing in the X-direction. Each of the p-type semiconductor regions 12 extends in the Y-direction.

A super junction structure is formed from the pillar portions 111 and the p-type semiconductor regions 12.

The n-type carrier concentration of the pillar portions 111 may be equal to or different from the p-type carrier concentration of the p-type semiconductor regions 12.

The n-type carrier concentration of the pillar portions 111 may be higher than the n-type carrier concentration of the lower portion of the n-type semiconductor layer 11 or equal to the n-type carrier concentration of the lower portion of the n-type semiconductor layer 11.

The base region 20 is a p-type semiconductor region provided on the p-type semiconductor region 12. The base region 20 is provided in the element region 1.

The source region 22 is selectively provided on the base region 20 in the front surface S1 portion of the structural body S. The source region 22 is provided in the element region 1. The source region 22 is an n-type semiconductor region. The n-type carrier concentration of the source region 22 is higher than the n-type carrier concentration of the n-type semiconductor layer 11 and the n-type carrier concentration of the pillar portions 111. The n-type carrier concentration of the source region 22 is higher than the p-type carrier concentration of the base region 20.

A gate electrode 24 opposes at least the base region 20 with a gate insulation layer 26 interposed. In other words, at least a portion of the gate insulation layer 26 is provided between the base region 20 and the gate electrode 24. The gate electrode 24 may further oppose, with the gate insulation layer 26 interposed, the pillar portion 111 and the source region 22. The gate electrode 24 includes, for example, polycrystalline silicon.

The source electrode 32 is provided on the front surface S1. The source region 22 is electrically connected to the source electrode 32. An insulating layer 28 is provided between the gate electrode 24 and the source electrode 32. The gate electrode 24 is electrically isolated from the source electrode 32 by the insulating layer 28.

The MOSFET is switched to the on-state by applying a voltage not less than the threshold to the gate electrode 24 in a state in which a voltage that is positive with respect to the source electrode 32 is applied to the drain electrode 30. At this time, a channel (an inversion layer) is formed in the region of the base region 20 at the gate insulation layer 26 vicinity.

When the MOSFET is in the off-state and the potential that is positive with respect to the potential of the source electrode 32 is applied to the drain electrode 30, a depletion layer spreads in the pillar portion 111 and the p-type semiconductor region 12 from the p-n junction surface of the pillar portion 111 and the p-type semiconductor region 12. A high breakdown voltage is obtained because the pillar portion 111 and the p-type semiconductor region 12 are depleted in a direction perpendicular to the junction surface of the pillar portion 111 and the p-type semiconductor region 12 to suppress the electric field concentration in directions parallel to the junction surface of the pillar portion 111 and the p-type semiconductor region 12.

The field plate electrode 14 is provided on the outer edge side of the structural body S with respect to the base region 20 and the source region 22. The field plate electrode 14 is provided on the pillar portion 111 and on the p-type semiconductor region 12 with an insulating layer 16 interposed. For example, the field plate electrode 14 is multiply provided in the direction from the element region 1 toward the terminal region 2.

The field plate electrode 14 has a floating potential. The field plate electrode 14 includes, for example, polycrystalline silicon including an impurity. For example, the field plate electrode 14 is provided to reduce the electric field strength at the boundary between the pillar portion 111 and the p-type semiconductor region 12.

The field plate electrode 14 is covered with an insulating layer 18.

The p-type semiconductor region 40 is provided inside the n-type semiconductor layer 11 in a portion of the terminal region 2. The p-type semiconductor region 40 is provided around the multiple p-type semiconductor regions 12.

The n-type semiconductor region 42 is selectively provided on the p-type semiconductor region 40. The n-type semiconductor region 42 is provided at the vicinity of the boundary between the p-type semiconductor region 40 and the n-type semiconductor layer 11. For example, the n-type carrier concentration of the n-type semiconductor region 42 is higher than the p-type carrier concentration of the p-type semiconductor region 40.

A draw-out electrode 38 is provided on the n-type semiconductor region 42. The draw-out electrode 38 is electrically connected to the n-type semiconductor region 42.

As shown in FIG. 1, the EQPR (Equivalent Potential Ring) electrode 36 is provided around the element region 1 in the terminal region 2. The EQPR electrode 36 is provided on the n-type semiconductor layer 11 and is provided around the multiple field plate electrodes 14. The EQPR electrode 36 is electrically connected to the n-type semiconductor region 42 via the draw-out electrode 38. The EQPR electrode 36 includes, for example, polycrystalline silicon.

For example, similarly to the n-type semiconductor region 42 and the EQPR electrode 36, the draw-out electrode 38 is provided in an annular configuration in the terminal region 2. The EQPR electrode 36, the draw-out electrode 38, the p-type semiconductor region 40, and the n-type semiconductor region 42 are configured so that the EQPR electrode 36 has the same potential as the drain electrode 30 when the voltage is applied to the drain electrode 30.

The first electrode 34 is provided on the pillar portions 111 and on the p-type semiconductor regions 12 in the terminal region 2 and is provided around the element region 1 along the X-Y plane as shown in FIG. 1. The first electrode 34 is positioned between the source electrode 32 and the EQPR electrode 36. The first electrode 34 includes, for example, polycrystalline silicon. The first electrode 34 may include a metal material.

As shown in FIG. 2 to FIG. 5, the first electrode 34 includes a first portion 341 and a second portion 342. The first portion 341 is connected to the n-type semiconductor layer 11. Specifically, the first portion 341 contacts the pillar portion 111 of the n-type semiconductor layer 11. The first portion 341 does not contact the p-type semiconductor region 12. The second portion 342 is the portion of the first electrode 34 provided on the source region 22 (the element region 1) side of the first portion 341.

For example, as shown in FIG. 2, the first portion 341 is multiply provided in the X-direction. A first portion 341a of the multiple first portions 341 that is positioned at the end in the X-direction extends in the Y-direction. For example, the length in the X-direction of the first portion 341 is longer than the length in the X-direction of the first portion 341a as shown in FIG. 2. However, the length in the X-direction of the first portion 341 may be the length in the X-direction of the first portion 341a or less.

In the example shown in FIG. 2, the first electrode 34 includes a first region 34a that extends in the X-direction and a second region 34b that extends in the Y-direction. The first region 34a includes the multiple first portions 341. The second region 34b includes at least a portion of the first portion 341a extending in the Y-direction.

In the first region 34a, the first portions 341 are provided to correspond respectively to the pillar portions 111 that overlap the first region 34a when viewed from the Z-direction. The first portions 341 may be provided on only a portion of the pillar portions 111 in the first region 34a. Or, the first electrode 34 may include only the first portion 341a; and the first portions 341 may not be included in the first region 34a.

In the first region 34a as shown in FIG. 2 to FIG. 5, at least a portion of the first portions 341 is provided between the field plate electrodes 14 in the Y-direction. In the second region 34b, at least a portion of the first portion 341a extending in the Y-direction is provided between the field plate electrodes 14 in the X-direction. For example, as shown in FIG. 3 and FIG. 5, a portion of at least one field plate electrode 14 of the multiple field plate electrodes 14 is provided between the n-type semiconductor layer 11 and the second portion 342 and between the p-type semiconductor region 12 and the second portion 342.

As an example as shown in FIG. 3 and FIG. 5, a length L1 in the Y-direction of the first region 34a is longer than a length L2 in the X-direction of the second region 34b. A length L3 in the Y-direction of the second portion 342 in the first region 34a is longer than a length L4 in the X-direction of the second portion 342 of the second region 34b.

However, the length L1 may be the length L2 or less. The length L3 may be the length L4 or less.

As an example as shown in FIG. 4 and FIG. 5, in the first region 34a, a length L5 in the Y-direction of the first portion 341 is longer than a length L6 in the X-direction of the first portion 341. However, the length L5 may be the length L6 or less.

For example, the distance in the Y-direction between the first region 34a and the element region 1 is shorter than the distance in the X-direction between the second region 34b and the element region 1. Accordingly, as an example as shown in FIG. 3 and FIG. 5, a distance L7 in the Y-direction between the first region 34a and the base region 20 is shorter than a distance L8 in the X-direction between the second region 34b and the base region 20. However, the distance L7 may be the distance L8 or more.

The operations and effects of the embodiment will now be described.

Because the semiconductor device 100 includes the first electrode 34 that includes the first portion 341 and the second portion 342, it is possible to suppress the decrease of the breakdown voltage of the semiconductor device 100.

The reason for this is as follows.

The breakdown voltage of the semiconductor device can be increased by providing the super junction structure formed from the p-type semiconductor regions 12 and the pillar portions 111 of the n-type semiconductor layer 11 in both the element region 1, in which the source region 22 is provided, and in the terminal region 2, which is provided around the element region 1. However, in the case where the electric field spreads into the terminal region 2, there is a possibility that the electric field may concentrate in the terminal region 2 and the breakdown voltage may decrease.

Conversely, in the case of a semiconductor device including the first electrode 34, it is possible to set the potential of the second portion 342 to be substantially equal to the potential of the pillar portion 111 of the multiple pillar portions 111 connected to the first portion 341. By providing a conductor having a potential that is equal to the potential of the pillar portions 111 on the source region 22 side of the first portion 341, the extension of the electric field is suppressed toward the side of the first portion 341 opposite to the side where the source region 22 is provided. As a result, the concentration of the electric field in the terminal region 2 is suppressed.

There are cases where the p-type carrier concentration of the p-type semiconductor regions 12 is set to be higher than the n-type carrier concentration of the pillar portions 111 to increase the avalanche energy of the semiconductor device. When such a configuration is employed, the electric field spreads into the terminal region 2 more easily; and the likelihood of the concentration of the electric field occurring in the terminal region 2 increases.

By applying the embodiment to a semiconductor device in which the p-type carrier concentration of the p-type semiconductor regions 12 is higher than the n-type carrier concentration of the pillar portions 111, it is possible to suppress the concentration of the electric field in the terminal region 2 while increasing the avalanche energy.

The spread of the depletion layer into the outer circumference of the semiconductor device can be suppressed in the case where the semiconductor device 100 includes the p-type semiconductor region 40, the n-type semiconductor region 42, and the EQPR electrode 36 in the terminal region 2. Therefore, for example, a leakage current from the dicing surface at the outer circumference of the semiconductor device can be suppressed.

On the other hand, because the electric field spreads easily into the terminal region 2 due to the pillar portions 111 and the p-type semiconductor regions 12, the electric field concentrates easily at the p-type semiconductor region 12 positioned at the outermost circumference or at the end portion of the EQPR electrode 36 due to the synergistic effect of the electric field extension being suppressed by the EQPR electrode 36.

When the voltage is applied to the semiconductor device, there are cases where negative ions included in the insulating layer, etc., or negative ions entering from the outside move through the semiconductor device along the electric field. In such a case, the electric field further concentrates at the end portion of the EQPR electrode 36 on the source region 22 side.

By applying the embodiment to the semiconductor device including the EQPR electrode 36, it is possible to suppress the concentration of the electric field in the p-type semiconductor region 12 of the outermost circumference while suppressing the spread of the electric field into the outer circumference of the semiconductor device.

This aspect will now be described in detail using FIGS. 6A to 6C.

Figure 6A:
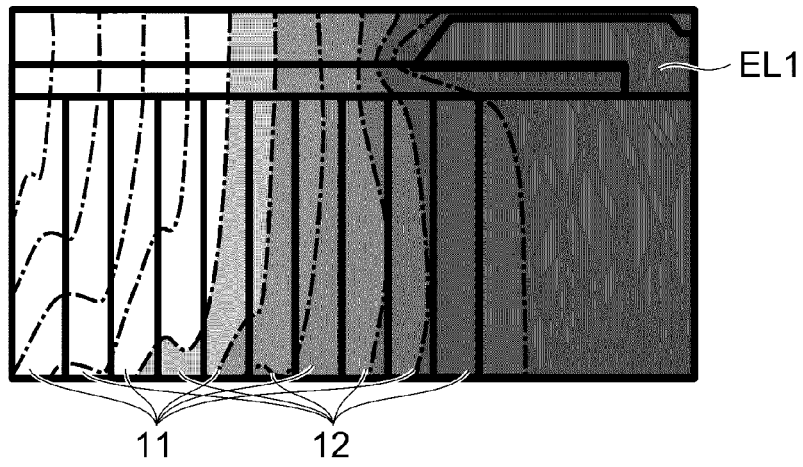
FIGS. 6A to 6C show the results of a simulation of the distribution of the potential for semiconductor devices.
Figure 6B:
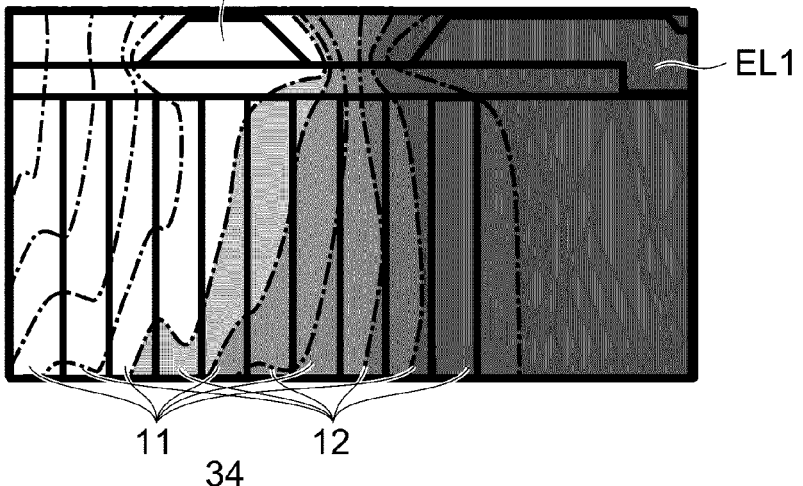
Figure 6C:
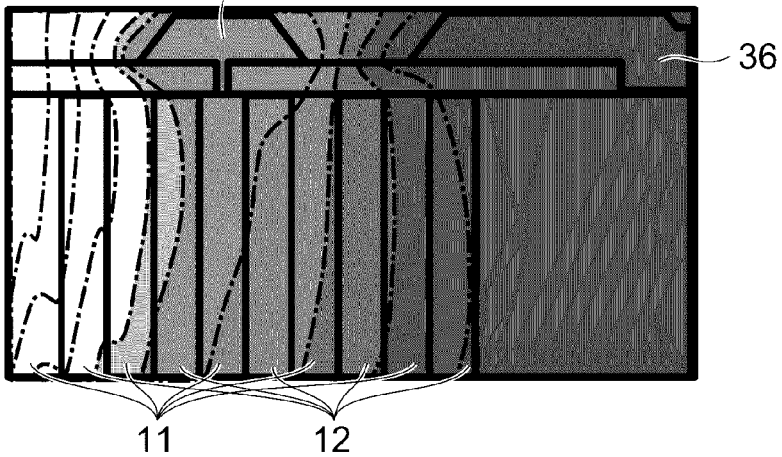

FIGS. 6A to 6C show the results of a simulation of the distribution of the potential for semiconductor devices. Specifically, FIG. 6A is the simulation results of the potential distribution of a semiconductor device of a first comparative example; and FIG. 6B is the simulation results of the potential distribution of a semiconductor device of a second comparative example. FIG. 6C is the simulation results of the potential distribution of the semiconductor device of the embodiment.

The semiconductor device shown in FIG. 6A includes the super junction structure and an EQPR electrode EL1. In addition to the super junction structure and the EQPR electrode EL1, the semiconductor device shown in FIG. 6B includes an electrode EL2 that has a floating potential. The semiconductor device shown in FIG. 6C includes the first electrode 34 and the EQPR electrode 36.

As shown in FIG. 6A, the electric field spreads toward the outer circumference of the semiconductor device. On the other hand, the spread of the electric field at the outer circumference of the semiconductor device is suppressed by the EQPR electrode EL1. As a result, the electric field concentrates at the end portion of the EQPR electrode EL1. Further, when the voltage is applied to the semiconductor device and negative ions are induced by the EQPR electrode EL1, the electric field concentrates even more at the end portion of the EQPR electrode EL1.

In the semiconductor device shown in FIG. 6B, the spread of the electric field toward the semiconductor device outer circumference is suppressed by the electrode EL2. However, when the voltage is applied to the semiconductor device in this state, the negative ions are induced not only by the end portion of the EQPR electrode EL1 but also by the end portion of the electrode EL2. As a result, there is a possibility that the electric field at the vicinity of the end portion of the electrode EL2 on the element region side may concentrate more than in the state shown in FIG. 6B; and degradation of the breakdown voltage may occur.

It can be seen that in the semiconductor device according to the embodiment shown in FIG. 6C, the concentration of the electric field at the end portion of the EQPR electrode 36 is relaxed sufficiently. The first electrode 34 is connected to the pillar portion 111 in the semiconductor device according to the embodiment. Therefore, even when the voltage is applied to the semiconductor device and the negative ions are induced by the first electrode 34, the change of the potential of the first electrode 34 due to the negative ions can be suppressed. Accordingly, unlike FIG. 6B, further concentration of the electric field from the state shown in FIG. 6C does not occur easily at the vicinity of the end portion of the first electrode 34 on the element region side.

As described above, according to the embodiment, even in the case where the semiconductor device includes the EQPR electrode, it is possible to suppress the concentration of the electric field of the electrode provided between the element region and the EQPR electrode and suppress the decrease of the breakdown voltage.

The embodiment can be used favorably in a semiconductor device having a configuration in which the pillar portions 111 and the p-type semiconductor regions 12 extend in one direction. In a semiconductor device having such a configuration, in the case where the p-type carrier concentration of the p-type semiconductor regions 12 undesirably becomes higher than the n-type carrier concentration of the pillar portions 111 due to manufacturing fluctuation, etc., the electric field easily extends further in the direction in which the pillar portions 111 and the p-type semiconductor regions 12 extend. Therefore, the likelihood of the electric field concentrating in the terminal region 2 increases even more. Accordingly, the embodiment which suppresses the concentration of the electric field in the terminal region of the semiconductor device is particularly effective in such a case.

For the semiconductor device having the configuration in which the pillar portions 111 and the p-type semiconductor regions 12 extend in one direction, it is possible to suppress the decrease of the breakdown voltage of the semiconductor device even more by the first electrode 34 having at least one of the configurations described below.

In the first configuration, the length L3 in the Y-direction of the second portion 342 in the first region 34a is longer than the length L4 in the X-direction of the second portion 342 of the second region 34b.

In the second configuration, the distance L7 in the Y-direction between the first region 34a and the gate electrode 24 is shorter than the distance L8 in the X-direction between the second region 34b and the gate electrode 24.

By employing at least one of the configurations recited above, it is possible to provide the tip of the second portion 342, which has the same potential as the pillar portion 111 to which the first portion 341 is connected, at a position that is more proximal to the element region 1. Therefore, it is possible to favorably suppress the extension of the electric field in the direction in which the pillar portions 111 and the p-type semiconductor regions 12 extend and in which the electric field extends easily. As a result, it is possible to suppress the decrease of the breakdown voltage in the terminal region of the semiconductor device including the pillar portions 111 and the p-type semiconductor regions 12 extending in one direction.

It is possible to suppress the extension of the electric field even more in the direction in which the pillar portions 111 and the p-type semiconductor regions 12 extend by combining the first configuration and the second configuration recited above.

When forming the first electrode 34, for example, there is a possibility that fluctuation of the position of the first portion 341 may occur due to positional shift of the exposure position in the photolithography process, etc. In the case where the position of the first portion 341 fluctuates and the first portion 341 contacts the p-type semiconductor region 12, the potential of the second portion 342 becomes high compared to the case where the first portion 341 contacts only the pillar portion 111. Therefore, there is a possibility that the concentration of the electric field in the terminal region 2 may be undesirably promoted.

Conversely, by setting the length L5 in the Y-direction of the first portion 341 to be longer than the length L6 in the X-direction of the first portion 341 in the first region 34a, it is possible to reduce the possibility of the first portion 341 contacting the p-type semiconductor region 12 while ensuring the contact surface area between the first portion 341 and the pillar portion 111.

First Modification of First Embodiment

A semiconductor device 110 according to a first modification of the first embodiment will now be described using FIG. 7 and FIG. 8.

Figure 7:
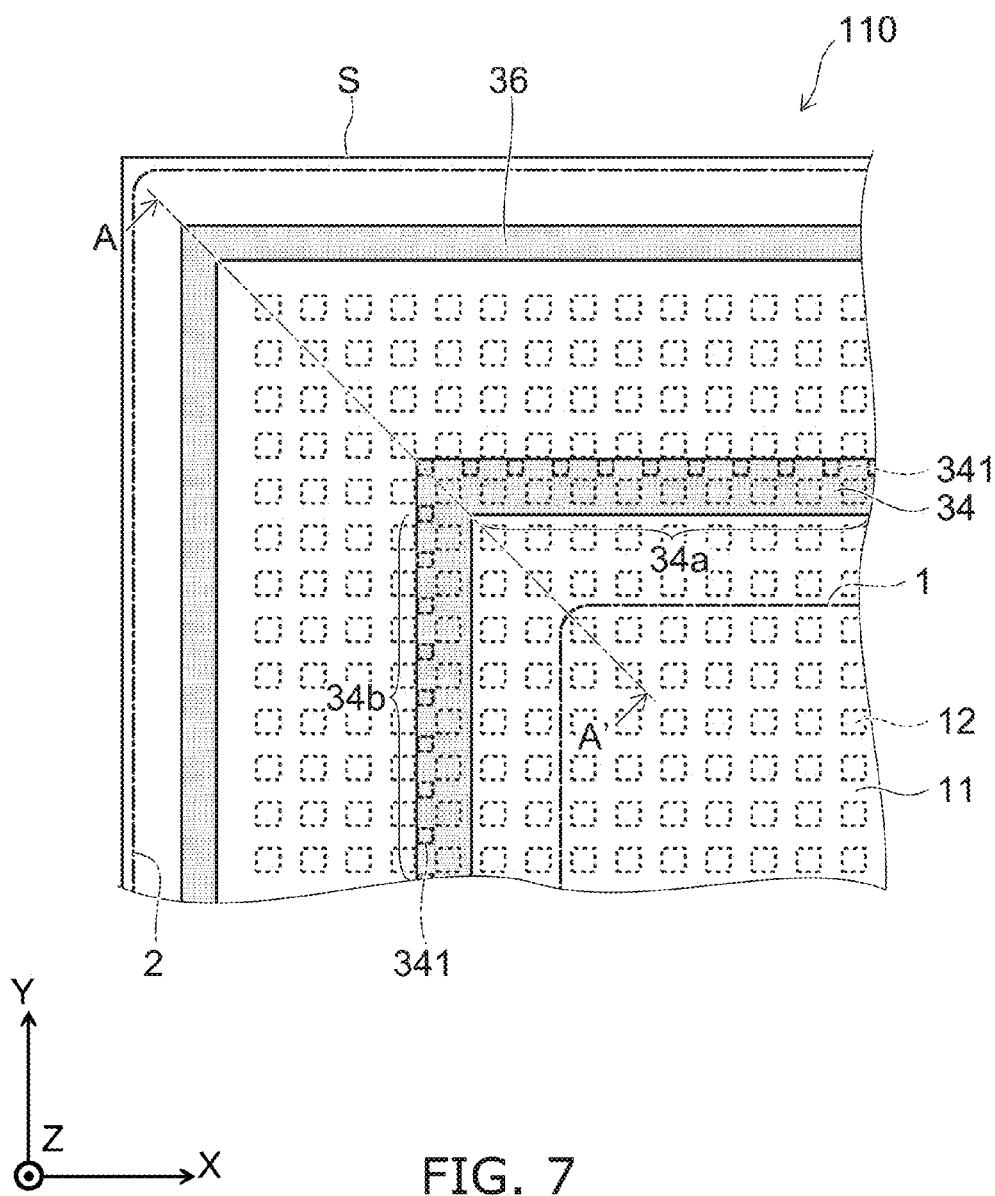
FIG. 7 is a plan view showing a portion of the semiconductor device 110 according to the first modification of the first embodiment.

FIG. 7 is a plan view showing a portion of the semiconductor device 110 according to the first modification of the first embodiment.

Figure 8:
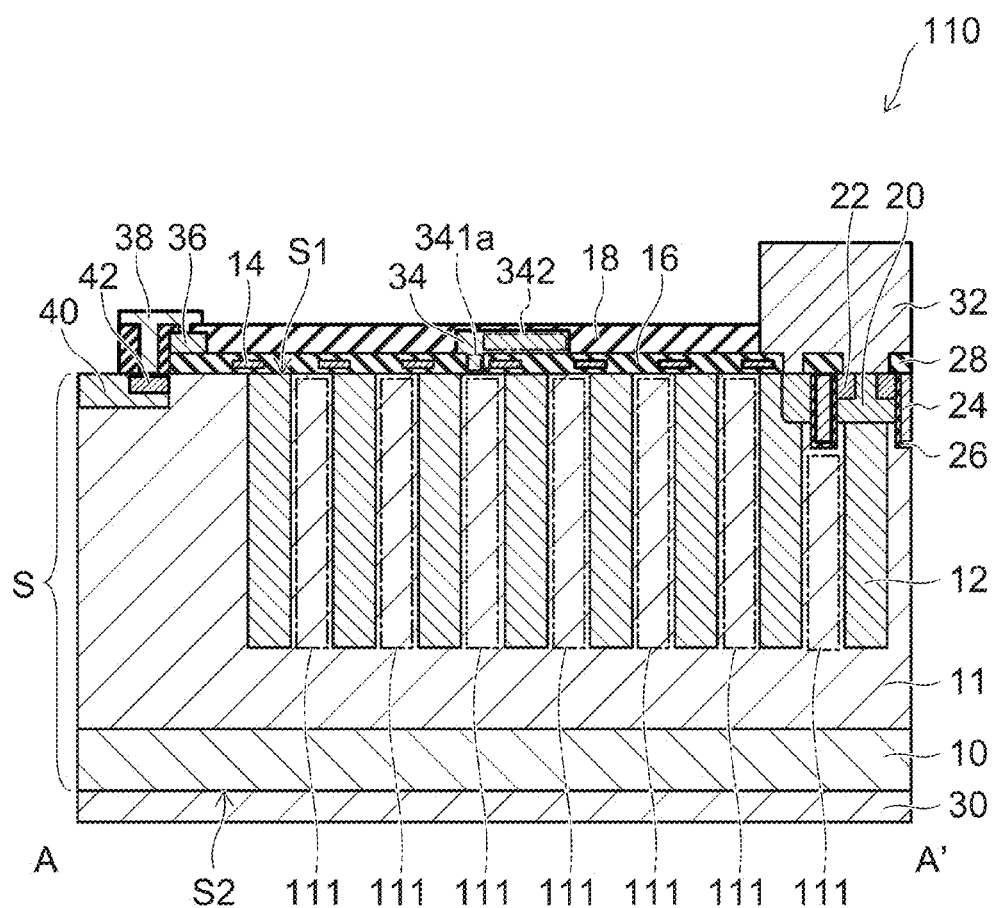
FIG. 8 is an A-A' cross-sectional view of FIG. 7.

FIG. 8 is an A-A' cross-sectional view of FIG. 7.

As shown in FIG. 7, the p-type semiconductor regions 12 are multiply provided in the X-direction and the Y-direction. The multiple p-type semiconductor regions 12 are not limited to the arrangement shown in FIG. 7 and may have, for example, a staggered arrangement. The number of p-type semiconductor regions 12 provided in the X-direction may be the same as or different from the number of p-type semiconductor regions 12 provided in the Y-direction. For example, for the p-type semiconductor regions 12, the length in the X-direction is equal to the length in the Y-direction.

As shown in FIG. 7 and FIG. 8, the n-type semiconductor layer 11 includes the pillar portions 111 positioned between the p-type semiconductor regions 12 in a direction that is orthogonal to the Z-direction and intersects the X-direction and the Y-direction. The first electrode 34 includes the first portions 341 that contact the pillar portions 111.

As shown in FIG. 7, for example, the first electrode 34 multiply includes the first portions 341 in the X-direction and the Y-direction. However, the configuration is not limited to the example; and the first electrode 34 may include a first portion 341 that extends in the X-direction or the Y-direction. When viewed from the Z-direction, the first portion 341 may be provided between the p-type semiconductor regions 12 in the X-direction and between the p-type semiconductor regions 12 in the Y-direction. In other words, the first electrode 34 may contact portions of the n-type semiconductor layer 11 positioned between the p-type semiconductor regions 12 adjacent to each other in the X-direction and portions of the n-type semiconductor layer 11 positioned between the p-type semiconductor regions 12 adjacent to each other in the Y-direction.

The various configurations described in the first embodiment also are employable for the first electrode 34.

In the modification as well, it is possible to suppress the concentration of the electric field in the terminal region 2.

Further, according to the modification, the electric field extends in the Y-direction in the same way that the electric field extends in the X-direction because the p-type semiconductor regions 12 are provided uniformly in the X-direction and the Y-direction. Accordingly, the positions, sizes, etc., of the first electrode 34, the EQPR electrode 36, or the field plate electrode 14 can be designed uniformly in the terminal region 2 regardless of the direction; and it is possible to easily design these members.

Second Modification of First Embodiment

Figure 9:
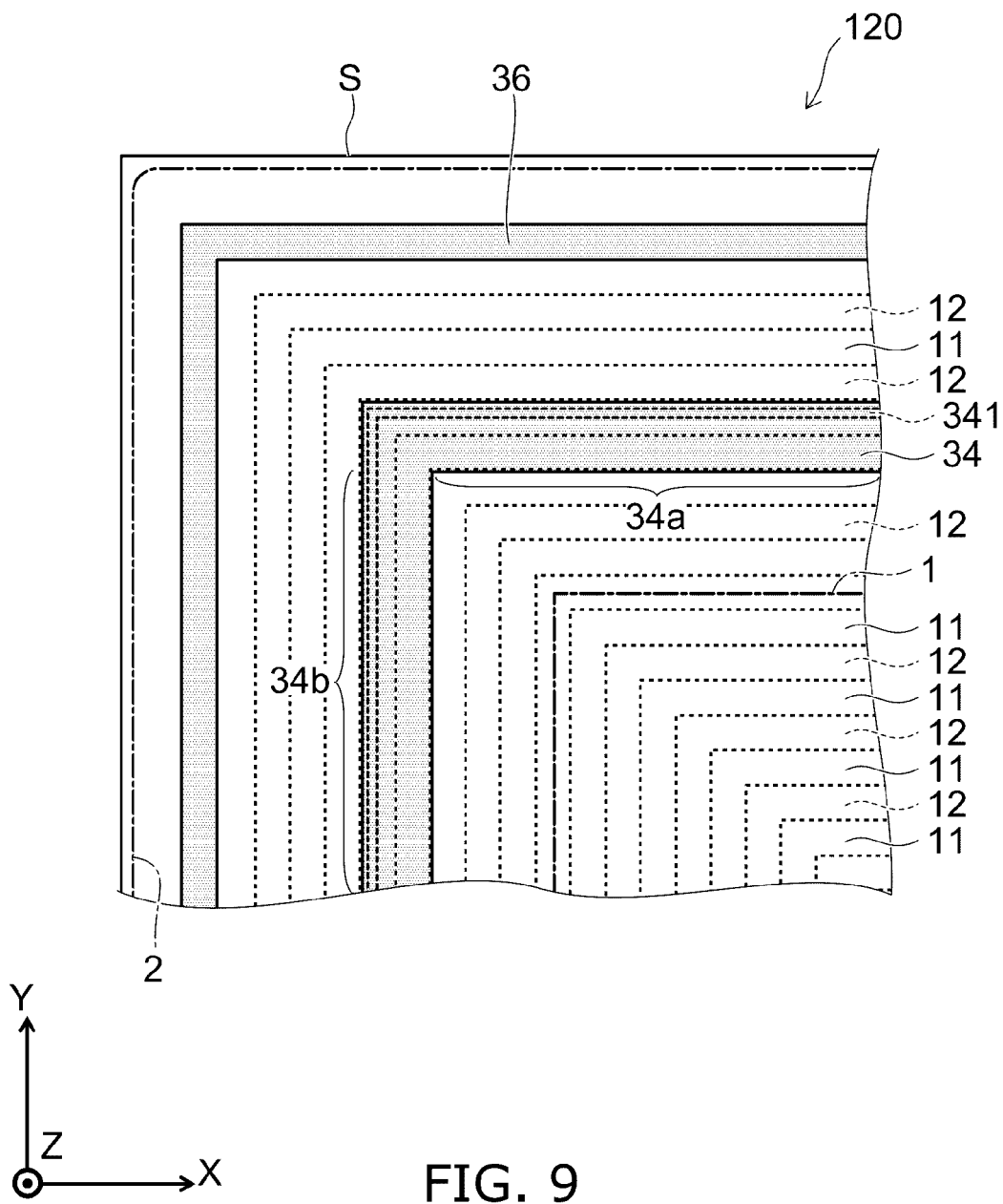
FIG. 9 is a plan view showing a portion of a semiconductor device according to a second modification of the first embodiment.

FIG. 9 is a plan view showing a portion of a semiconductor device 120 according to a second modification of the first embodiment.

In the modification, the p-type semiconductor regions 12 are quadrilaterals and have annular configurations when viewed from the Z-direction. The p-type semiconductor regions 12 are multiply provided in a direction from the center of the structural body S toward the outer circumference of the structural body S. Similarly to the p-type semiconductor regions 12, the first electrode 34 is a quadrilateral and has an annular configuration when viewed from the Z-direction. The first electrode 34 is provided around the element region 1.

The region 34a of the first electrode 34 extending in the X-direction includes the first portion 341 extending in the X-direction. The region 34a may include the first portion 341 that is multiply provided in the X-direction.

The region 34b of the first electrode 34 extending in the Y-direction includes the first portion 341 extending in the Y-direction. The region 34b may include the first portion 341 that is multiply provided in the Y-direction.

In the modification as well, it is possible to suppress the concentration of the electric field in the terminal region 2.

Further, in the modification as well, the design of the first electrode 34 is easy because the electric field extends in the Y-direction in the same way that the electric field extends in the X-direction.

Third Modification of First Embodiment

Figure 10:
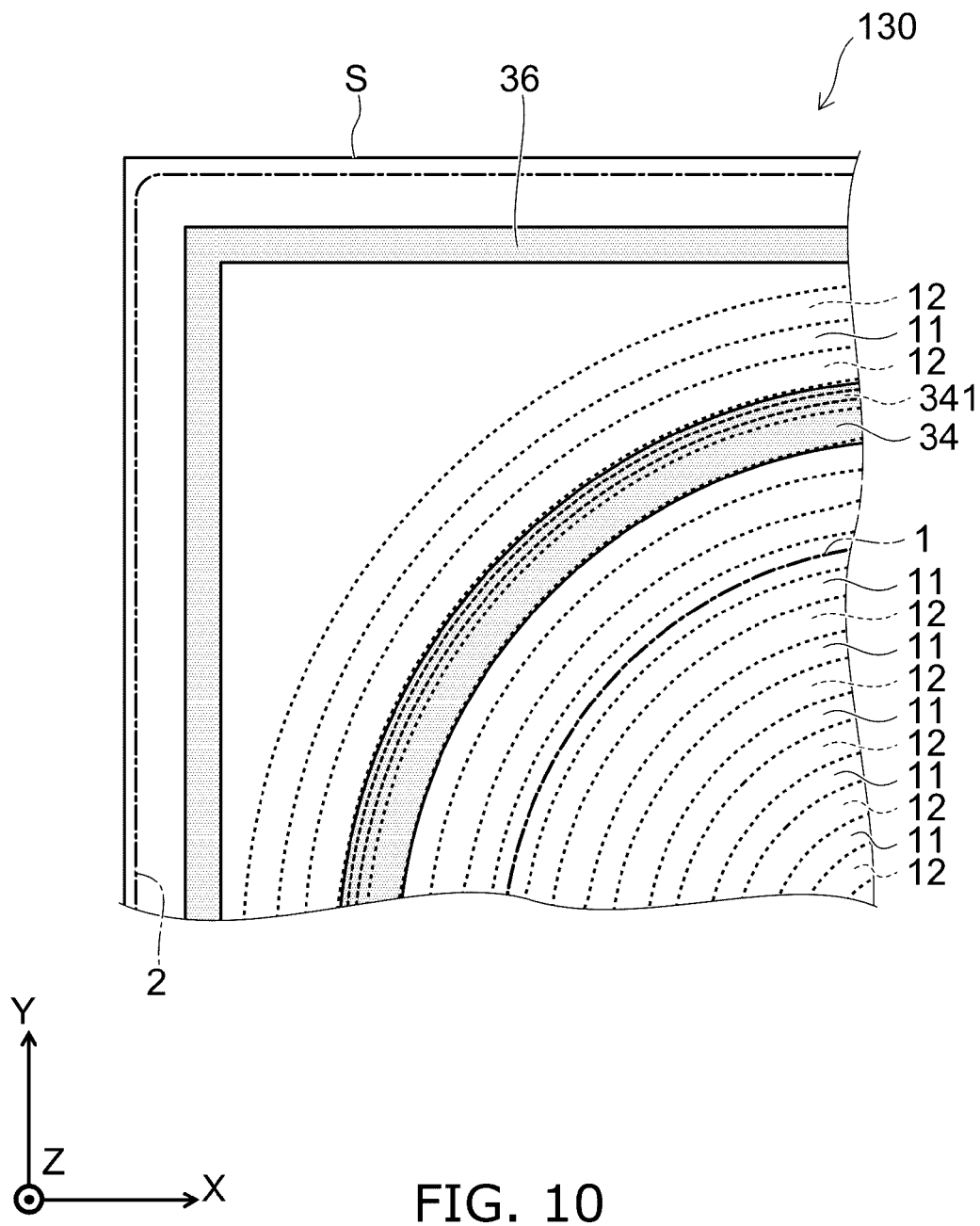
FIG. 10 is a plan view showing a portion of a semiconductor device according to a third modification of the first embodiment.

FIG. 10 is a plan view showing a portion of a semiconductor device 130 according to a third modification of the first embodiment.

In the modification, the p-type semiconductor regions 12 have annular configurations when viewed from the Z-direction. The p-type semiconductor regions 12 are multiply provided in a direction from the center of the structural body S toward the outer circumference of the structural body S. Similarly to the p-type semiconductor regions 12, the first electrode 34 and the first portion 341 have annular configurations when viewed from the Z-direction. The first electrode 34 is provided around the element region 1.

In the modification as well, it is possible to suppress the concentration of the electric field in the terminal region 2.

Fourth Modification of First Embodiment

Figure 11:
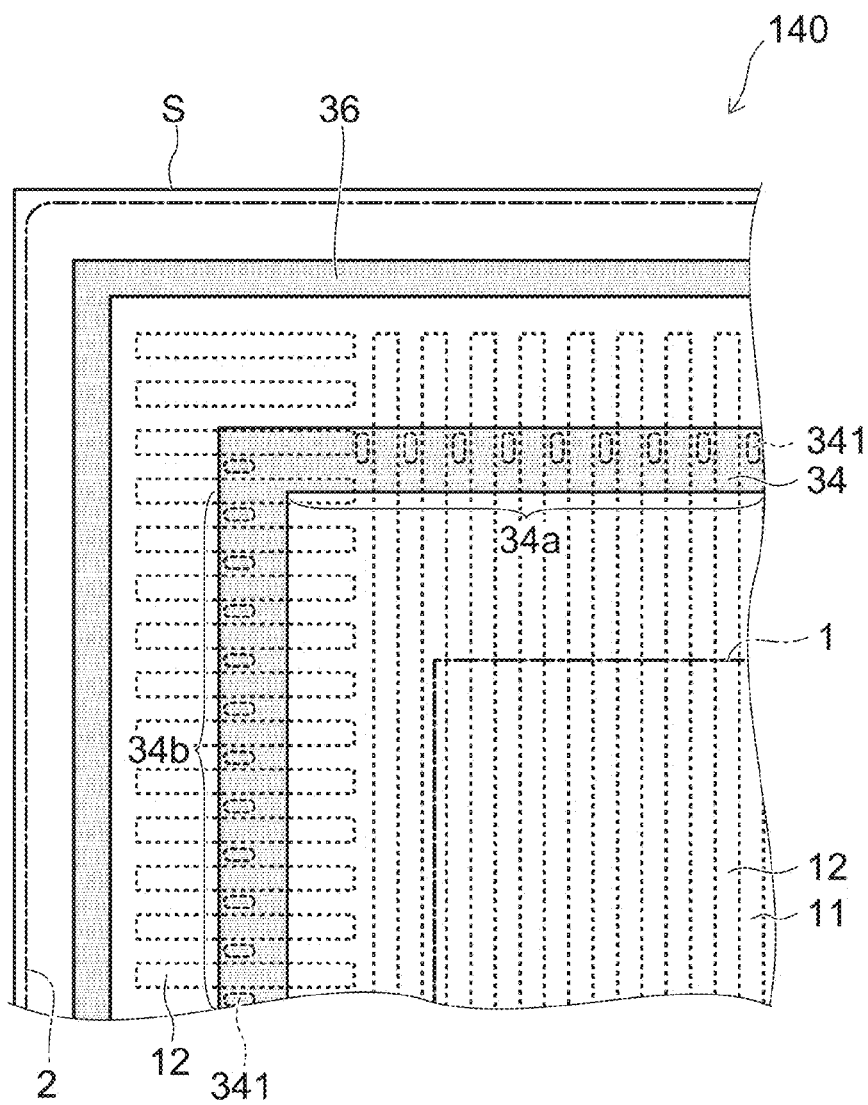
FIG. 11 is a plan view showing a portion of a semiconductor device according to a fourth modification of the first embodiment.
Figure 11:
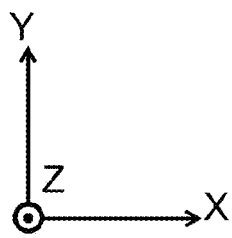

FIG. 11 is a plan view showing a portion of a semiconductor device 140 according to a fourth modification of the first embodiment.

In the modification, some of the p-type semiconductor regions 12 extend in the X-direction; and other p-type semiconductor regions 12 extend in the Y-direction. For example, only the p-type semiconductor regions 12 that extend in the Y-direction are provided in the element region 1; and the p-type semiconductor regions 12 that extend in the Y-direction and the p-type semiconductor regions 12 that extend in the X-direction are provided in the terminal region 2.

At least a portion of the region 34a of the first electrode 34 extending in the X-direction is provided on the p-type semiconductor regions 12 extending in the Y-direction. The region 34a includes the first portion 341 that is multiply provided in the X-direction.

At least a portion of the region 34b of the first electrode 34 extending in the Y-direction is provided on the p-type semiconductor regions 12 extending in the X-direction. The region 34b includes the first portion 341 that is multiply provided in the Y-direction.

In the modification as well, it is possible to suppress the concentration of the electric field in the terminal region 2.

Second Embodiment

A semiconductor device 200 according to a second embodiment will now be described using FIG. 12 to FIG. 14.

Figure 12:
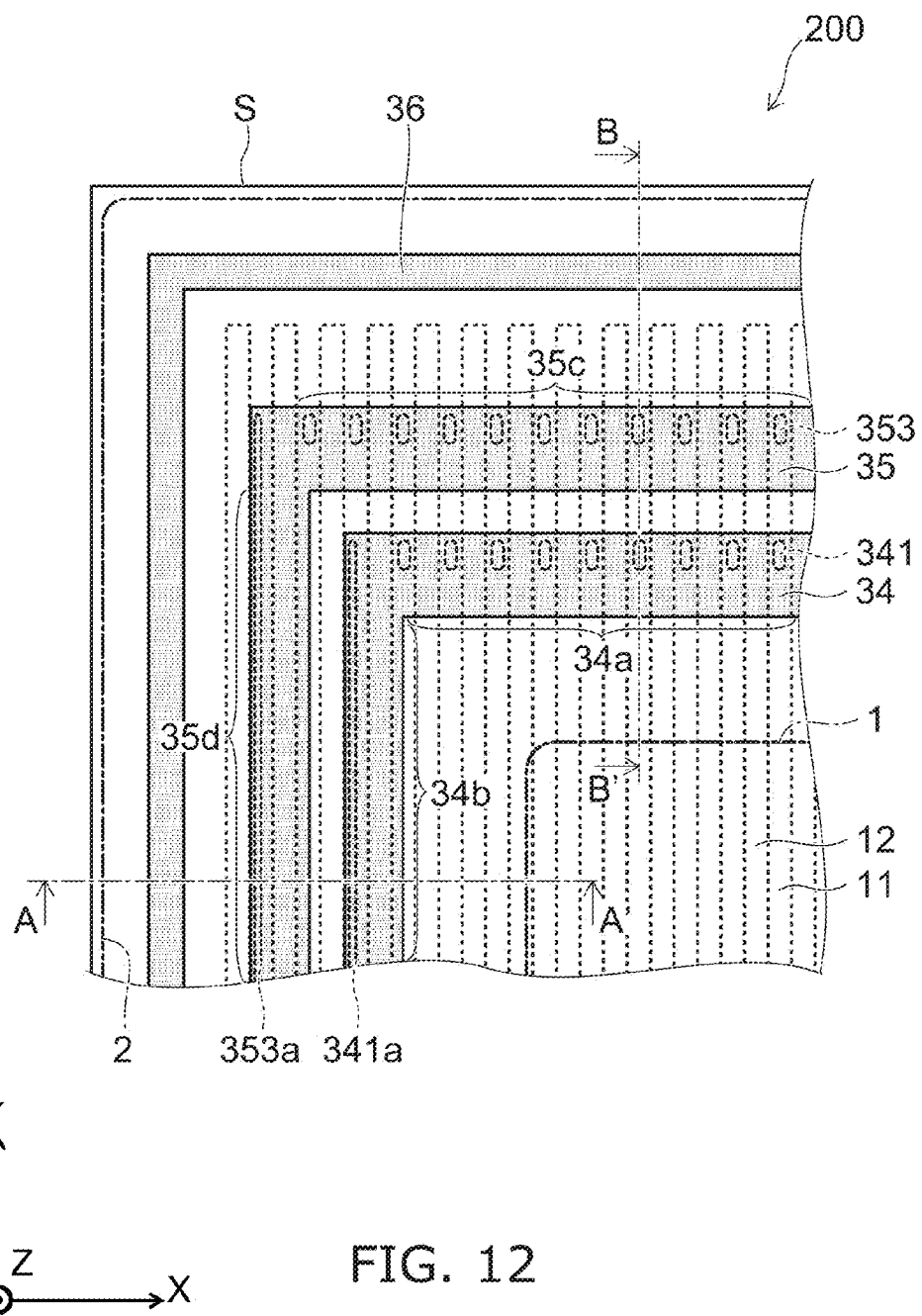
FIG. 12 is a plan view showing a portion of the semiconductor device according to the second embodiment.

FIG. 12 is a plan view showing a portion of the semiconductor device 200 according to the second embodiment.

Figure 13:
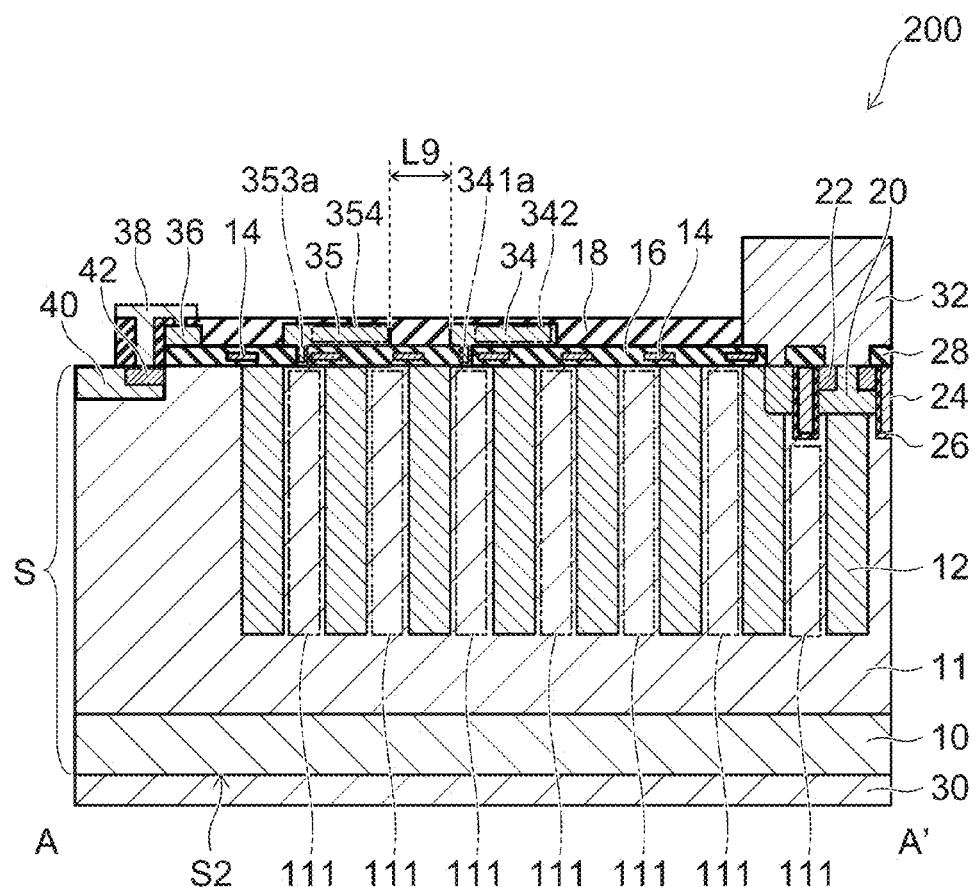
FIG. 13 is an A-A' cross-sectional view of FIG. 12.

FIG. 13 is an A-A' cross-sectional view of FIG. 12.

Figure 14:
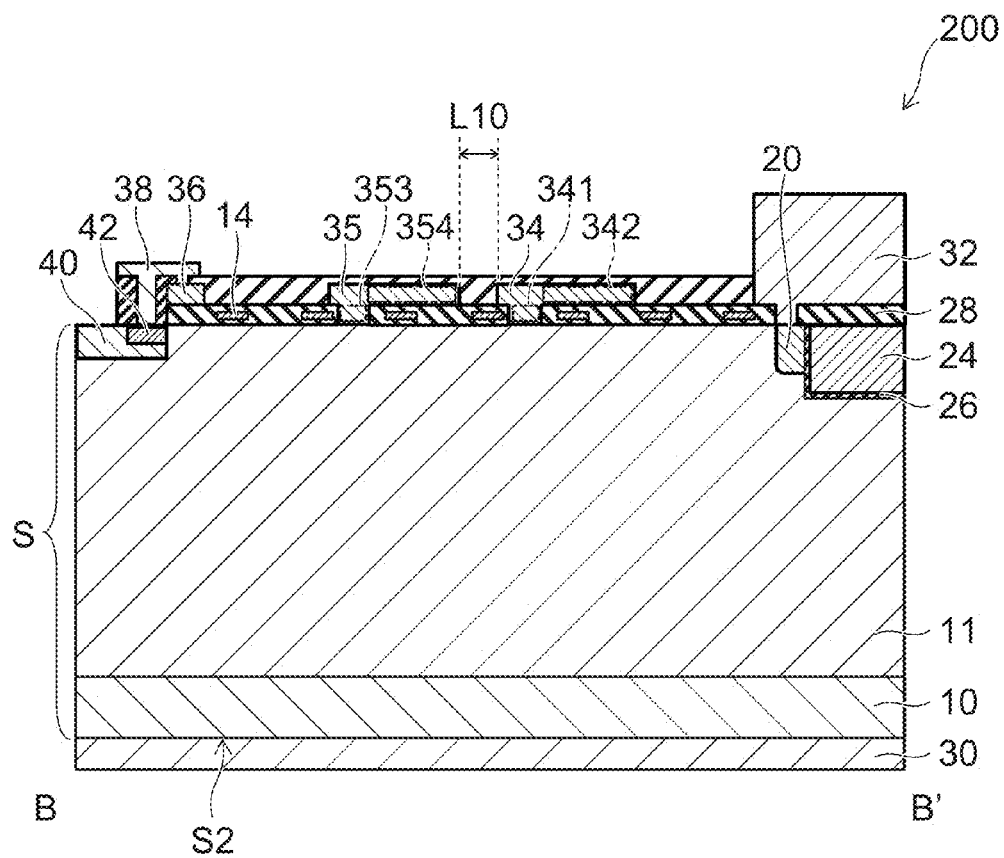
FIG. 14 is a B-B' cross-sectional view of FIG. 12.

FIG. 14 is a B-B' cross-sectional view of FIG. 12.

Compared to the semiconductor device 100, for example, the semiconductor device 200 further includes a third electrode 35. Other than the third electrode 35, a configuration similar to that of the semiconductor device 100 is employable as the configuration of the semiconductor device 200.

The third electrode 35 is provided around the element region 1 on the n-type semiconductor layer 11 and on the p-type semiconductor regions 12. The third electrode 35 is provided around the first electrode 34; and the EQPR electrode 36 is provided around the third electrode 35.

As shown in FIG. 13 and FIG. 14, similarly to the first electrode 34, the third electrode 35 includes third portions 353 that are connected to the pillar portions 111, and a fourth portion 354 that is provided on the source region 22 side of the third portions 353.

Various configurations similar to those of the first portion 341 are employable for the third portion 353. Various configurations similar to those of the second portion 342 are employable for the fourth portion 354.

The third electrode 35 includes a third region 35c that extends in the X-direction and a fourth region 35d that extends in the Y-direction. The width of the fourth portion 354 in the third region 35c may be the same as or different from the width of the second portion 342 in the first region 34a. The width of the fourth portion 354 in the fourth region 35d may be the same as or different from the width of the second portion 342 in the second region 34b.

For example, a distance L10 in the Y-direction between the first electrode 34 and the third electrode 35 is shorter than a distance L9 in the X-direction between the first electrode 34 and the third electrode 35. However, the distance L10 may be the distance L9 or more.

By the semiconductor device 200 further including the third electrode 35 in addition to the first electrode 34, it is possible to suppress the concentration of the electric field in the terminal region 2 even more.

The semiconductor device according to the embodiment may further include an electrode that is provided around the element region 1 and has a configuration similar to those of the first electrode 34 and the third electrode 35.

For example, the comparison of the carrier concentrations between the semiconductor regions described in the embodiments recited above can be confirmed using a SCM (scanning capacitance microscope).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first semiconductor layer of a first conductivity type, the first semiconductor layer including a plurality of first semiconductor regions;
a plurality of second semiconductor regions of a second conductivity type, the second semiconductor regions being provided respectively between the first semiconductor regions;
a third semiconductor region of the second conductivity type provided on the second semiconductor region;
a fourth semiconductor region of the first conductivity type provided on the third semiconductor region;
a gate electrode;
an insulating layer provided between the third semiconductor region and the gate electrode; and
a first electrode provided around the fourth semiconductor region and positioned on the first semiconductor region and on the second semiconductor region, the first electrode including
a first portion connected to the first semiconductor region, and
a second portion provided on the fourth semiconductor region side of the first portion.

2. The device according to claim 1, further comprising:
a fifth semiconductor region of the second conductivity type provided inside the first semiconductor layer and positioned around the plurality of second semiconductor regions;
a sixth semiconductor region of the first conductivity type provided on the fifth semiconductor region; and
a second electrode provided on the first semiconductor layer, connected to the sixth semiconductor region, and positioned around the first electrode.

3. The device according to claim 1, wherein
the first semiconductor regions and the second semiconductor regions are provided alternately in a first direction, and
the first semiconductor regions and the second semiconductor regions extend in a second direction orthogonal to the first direction.

4. The device according to claim 1, wherein
a plurality of the first portions is provided, and
the plurality of first portions is arranged in the first direction.

5. The device according to claim 4, wherein the first portion of the plurality of first portions positioned at an end in the first direction extends in the second direction.

6. The device according to claim 4, wherein
the first electrode includes a first region and a second region, the first region extending in the first direction, the second region extending in the second direction, and a length in the second direction of the second portion in the first region is longer than a length in the first direction of the second portion in the second region.

7. The device according to claim 6, wherein a distance in the second direction between the first region and the third semiconductor region is shorter than a distance in the first direction between the second region and the third semiconductor region.

8. The device according to claim 1, further comprising:
a third electrode provided around the first electrode, separated from the first electrode, and positioned on the first semiconductor region and on the second semiconductor region, the third electrode including
a third portion connected to the first semiconductor region, and
a fourth portion provided on the fourth semiconductor region side of the third portion.

9. The device according to claim 1, wherein a carrier concentration of the second conductivity type of the second semiconductor regions is higher than a carrier concentration of the first conductivity type of the first semiconductor regions.

10. The device according to claim 1, wherein a carrier concentration of the second conductivity type of the second semiconductor regions is equal to a carrier concentration of the first conductivity type of the first semiconductor regions.

11. The device according to claim 1, wherein a carrier concentration of the second conductivity type of the second semiconductor regions is lower than a carrier concentration of the first conductivity type of the first semiconductor regions.

12. The device according to claim 1, further comprising a fourth electrode provided around the fourth semiconductor region and separated from the first electrode, the first semiconductor regions, and the second semiconductor regions, the first electrode being provided around the fourth electrode, a portion of the fourth electrode being positioned between a portion of the first electrode and an interface between the first semiconductor region and the second semiconductor region.

13. The device according to claim 12, further comprising a fifth electrode provided on the fourth semiconductor region and electrically connected to the fourth semiconductor region, at least a portion of the fourth electrode being positioned between the first portion and the fifth electrode.

14. The device according to claim 1, wherein the plurality of second semiconductor regions is arranged in a first direction and a second direction orthogonal to the first direction.

15. The device according to claim 1, wherein each of the second semiconductor regions has an annular configuration.

* * * * *